US009042112B2

(12) United States Patent
Guan et al.

(10) Patent No.: US 9,042,112 B2
(45) Date of Patent: May 26, 2015

(54) CONVERTER POWER UNIT AND ITS BUS BARS

(71) Applicants: Wei Guan, Taoyuan Hsien (TW); Jian Jiang, Taoyuan Hsien (TW); Bagao Li, Taoyuan Hsien (TW); Kaitian Yan, Taoyuan Hsien (TW); Hongyang Wu, Taoyuan Hsien (TW)

(72) Inventors: Wei Guan, Taoyuan Hsien (TW); Jian Jiang, Taoyuan Hsien (TW); Bagao Li, Taoyuan Hsien (TW); Kaitian Yan, Taoyuan Hsien (TW); Hongyang Wu, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 291 days.

(21) Appl. No.: 13/682,722

(22) Filed: Nov. 20, 2012

(65) Prior Publication Data
US 2013/0271941 A1 Oct. 17, 2013

(30) Foreign Application Priority Data
Apr. 11, 2012 (CN) .......................... 2012 1 0104947

(51) Int. Cl.
H05K 1/18 (2006.01)
H05K 7/18 (2006.01)
(52) U.S. Cl.
CPC ........................................ *H05K 7/18* (2013.01)
(58) Field of Classification Search
USPC ........................ 361/675–678, 679.46–679.54, 361/688–722, 752, 760–762, 796, 831
See application file for complete search history.

(56) References Cited

U.S. PATENT DOCUMENTS

| 6,160,726 A | 12/2000 | Mori et al. |
|---|---|---|
| 7,092,262 B2 | 8/2006 | Ryan et al. |
| 7,248,483 B2 | 7/2007 | West |
| 7,443,392 B2 | 10/2008 | Tsubaki |
| 7,561,451 B2 | 7/2009 | Tracy et al. |
| 8,355,244 B2 * | 1/2013 | Kimura et al. ................ 361/676 |
| 8,724,313 B2 * | 5/2014 | Nakasaka et al. ......... 361/679.46 |
| 2004/0062006 A1 * | 4/2004 | Pfeifer et al. ................. 361/699 |
| 2005/0259402 A1 * | 11/2005 | Yasui et al. ................... 361/716 |
| 2007/0253164 A1 * | 11/2007 | Matsuo et al. ................ 361/699 |
| 2008/0130223 A1 * | 6/2008 | Nakamura et al. ............ 361/689 |
| 2009/0231811 A1 * | 9/2009 | Tokuyama et al. ........... 361/699 |
| 2010/0315780 A1 * | 12/2010 | Murakami .................... 361/699 |

OTHER PUBLICATIONS

Intellectual Property Office, Ministry of Economic Affairs, R.O.C., "Office Action", dated Apr. 17, 2014, Taiwan.

* cited by examiner

*Primary Examiner* — Courtney Smith
(74) *Attorney, Agent, or Firm* — Tim Tingkang Xia, Esq.; Morris, Manning & Martin, LLP

(57) ABSTRACT

A converter power unit comprises: a heat sink; n power switch modules on the heat sink; a first group of laminated bus bars comprising a first and a second bus bar; a capacitor group comprising m capacitor; a second group of laminated bus bars comprising a third and a fourth bus bar, the first bus bar is connected with the third bus bar, the second bus bar is connected with the fourth bus bar; providing that vertical projection areas projected by an area occupied by the n power switch modules and projected by the capacitor group on a first plane perpendicular to an axial direction of the capacitor group are defined as a first and a second projection areas respectively, the first and the second projection area have an overlapped area. The present application can reduce the stray inductances in the commutating loop of the converter.

16 Claims, 10 Drawing Sheets

CONVERTER POWER UNIT AND ITS BUS BARS

CROSS REFERENCE TO RELATED APPLICATIONS

The present invention claims priority under 35 U.S.C. §119 to Chinese Patent Application No. 201210104947.8, filed on Apr. 11, 2012, the entire content of which is incorporated herein by reference.

FIELD OF THE INVENTION

The present application relates to a high power converter, in particular relates to the structures of a power unit of a high power voltage source converter (VSC) and its bus bars.

BACKGROUND OF THE INVENTION

Today, electric power and electronic technology are being developed towards high frequency, high power and high power density. In the high power converters (with power levels from several hundred Kw to several Mw), the high frequency is embodied in selection of higher switch frequencies (form several kHz to several tens of kHz), the high power is embodied in selection of the power modules (IGBT/IGCT, etc.) with higher rating currents, and the high power density means higher power to be obtained per unit bulk, i.e., under the same power level, the bulk of the converter is made smaller.

Consequently, more and more new technologies are applied to the high power converters, such as using a plurality of IGBT modules connected in parallel to achieve higher current output (namely, higher power under the same output voltage), using the laminated bus bars to reduce the inner stray inductances of the DC-link capacitors as well as the stray inductances between the DC-link capacitors and the IGBT power modules, and the like.

SUMMARY OF THE INVENTION

In order to overcome the deficiencies in the prior art, one object of the present application is to provide a power unit of a high power converter and its bus bars. Specifically, the present application can minimize the stray inductances within the DC-link capacitors and the stray inductances between the DC-link capacitors and the power switch modules, by improving the structures and layouts of the power unit and its bus bars.

Another object of the present application is to make the stray inductances between the power switch modules and the DC-link capacitors to be uniform, and to minimize the bulk of the power unit of the converter (i.e., converter power unit), so as to improve the power density of the whole system.

In order to achieve the above objects, the present application provides a converter power unit, which comprises: a heat sink; n power switch modules provided on the heat sink, each of the power switch modules having a positive terminal and a negative terminal, wherein n is an integer and n≥1; a first group of laminated bus bars comprising a first bus bar and a second bus bar, the first bus bar being connected to the positive terminal of the power switch modules, and the second bus bar being connected to the negative terminals of the power switch modules; a capacitor group comprising m capacitors and having a positive terminal and a negative terminal, wherein m is an integer and m≥1; and a second group of laminated bus bars comprising a third bus bar and a fourth bus bar, the third bus bar being connected to the positive terminal of the capacitor group, and the fourth bus bar being connected to the negative terminal of the capacitor group, wherein the first bus bar is connected with the third bus bar, and the second bus bar is connected with the fourth bus bar; and providing that a vertical projection area projected by an area occupied by the n power switch modules on a first plane is defined as a first projection area, and a vertical projection area projected by the capacitor group on the first plane is defined as a second projection area, the first projection area and the second projection area have an overlapped area overlapped each other, wherein the first plane is a plane that is perpendicular to an axial direction of the capacitor group.

According to an embodiment, each of the first bus bar and the second bus bar may comprise: a connection portion for the power switch modules placed on one side of the first bus bar or the second bus bar and being connected to the positive or negative terminal of each power switch modules, the connection portion for the power switch modules is provided with connection holes for power switch modules thereon; and a connection portion for the capacitor group placed on the other side of the first bus bar or the second bus bar and being connected to the third bus bar or fourth bus bar, the connection portion for the capacitor group is provided with connection holes for capacitor group thereon.

According to an embodiment, each of the first bus bar and the second bus bar may further comprise: a support portion connected to the connection portion for the power switch modules and the connection portion for the capacitor group of the first bus bar or the second bus bar, wherein the support portion of the first bus bar and the support portion of the second bus bar are adjacently overlapped to form a juxtaposition structure of support portion, the connection portion for the power switch modules and the connection portion for the capacitor group of the first bus bar are placed on one side of the juxtaposition structure of support portion, and the connection portion for the power switch modules and the connection portion for the capacitor group of the second bus bar are placed on the other side of the juxtaposition structure of support portion.

According to an embodiment, the connection portions for power switch modules and the connection portions for capacitor group of the first bus bar and the second bus bar and the juxtaposition structure of support portion may together form a "⊥" shaped figure, wherein the juxtaposition structure of support portion forms a middle vertical bar of the "⊥" shaped figure, the two connection portions for power switch modules respectively placed on two sides of the juxtaposition structure of support portion together form a bottom transverse bar of the "⊥" shaped figure, and two connection portions for capacitor group respectively placed on two sides of the juxtaposition structure of support portion together form a top transverse bar of the "⊥" shaped figure.

According to an embodiment, the two connection portions for power switch modules and the two connection portions for capacitor group may be complete strip or incomplete strip with notches.

According to an embodiment, the two support portions may have a preset length and a preset width.

According to an embodiment, the preset length may be equal to or greater than a distance between terminals of same polarity of two power switch modules which are positioned at two ends of the first projection area along its length direction.

According to an embodiment, an insulation layer may be interposed between the two support portions in the juxtaposition structure of support portion.

According to an embodiment, an interval between the two support portions in the juxtaposition structure of support portion may be equal to or less than a distance between the positive terminal and the negative terminal of each power switch module.

According to an embodiment, the first bus bar and the second bus bar may be mirror symmetry along a length direction of the juxtaposition structure of support portion.

According to an embodiment, the connection holes for power switch modules or the connection holes for capacitor group may be provided symmetrically with respect to a perpendicular bisection plane that equally divides the preset length of the support portion into two parts.

According to an embodiment, providing that a center point of the first projection area is defined as a first center point, and a center point of the second projection area is defined as a second center point, a distance d between the first center point and the second center point may satisfy the following equation: $0 \leq d \leq L/2$, wherein L is a length of the first projection area.

According to an embodiment, the power switch modules may be IGBT modules, MOSFET modules or IGCT modules.

According to an embodiment, the converter power unit may have one-phase, three-phase or multi-phase of AC outputs.

According to an embodiment, the converter power unit may be a single-phase power unit, a three-phase unit or a multiphase power unit.

In order to achieve the above objects, the present application also provides bus bars in a converter power unit comprising the first bus bar and the second bus bar described as above.

The converter power unit in the present application utilizes the laminated bus bars in a "⊤" shaped figure as the bus bars of the power switch units of the converter, such reasonable and compact structure can greatly reduce the stray inductances in the current commutating loop of the converter, and this "⊥" shaped structure of the laminated bus bars can make the lengths of current commutating loops from the power switch modules to the DC-link capacitors substantially uniform, and also make the dynamic currents of the power switch modules during commutating substantially equal. Accordingly, operation states of the power switch modules are substantially uniform, and the problem that reliability is deteriorated due to an overlarge dynamic current applied to a certain part or component can be avoided. Thereby, the usage security and the lifespan of the whole system can be improved.

In the embodiments of the present application, if the power switch modules (together with the heat sink located underneath) have a width of W1 and a height of H1, and the capacitor group has a width of W2 and a height of H2, a width of the power unit of the present application consisting of the power switch modules and the capacitor group is the larger one of W1 and W2, and a height thereof is the larger one of H1 and H2. When W1 and W2, H1 and H2 are designed to have a smaller differences, namely, W1 and W2, H1 and H2 are approximately equal to each other, the width of the converter power unit of the present application and its cabinet may reduce by about a half compared with the prior art in which the capacitor group is placed on the left or right side of the power switch modules, or the height of the converter power unit of the present application and its cabinet may reduce by about a half compared with the prior art in which the capacitor group is placed on the upper or lower side of the power switch modules. Therefore, the present application can greatly improve the space utilization efficiency and the power density of the whole system.

BRIEF DESCRIPTION OF THE DRAWING

The details of the configurations and the embodiments will be described below with reference to the accompanying drawings, in which like reference numbers will be used to refer to like parts.

DESCRIPTION OF THE EMBODIMENTS

Figure 1:
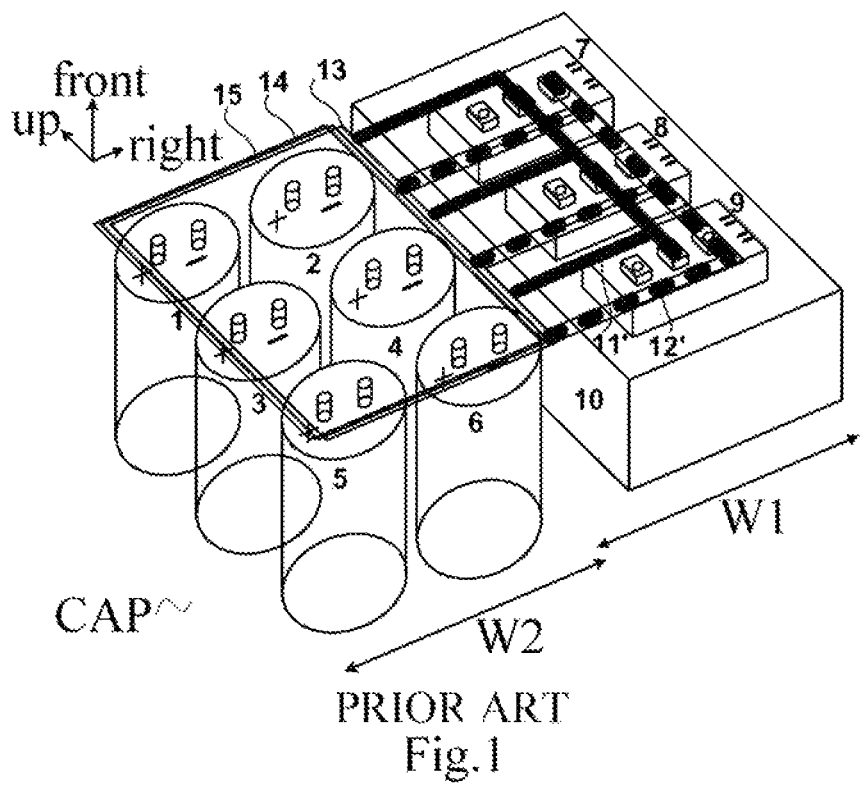
FIG. 1 is a perspective view illustrating a converter power unit according to one embodiment of the prior art.

A plurality of embodiments in the present application will be described in detail in conjunction with the accompanying drawings. The details of the plurality of embodiments will be illustrated in the following depiction for clarity. However, it should be known that the embodiments described herein are not intended to limit the present application.

Hereinafter, the orientation depiction of respective elements of a converter is subject to the real orientation of the converter being mounted in a cabinet shown in the accompanying drawings. For example, as indicated by the arrows in FIG. 1 and FIG. 16, when the converter is mounted in the cabinet, a direction from a heat sink 10 of the converter towards power switch modules is defined as a front-back direction, a direction of a straight line formed from a positive terminal, a negative terminal and an output terminal of the power switch module is defined as a left-right direction, and a direction perpendicular to the both directions described above is defined as an up-down direction.

The dimension of each element may be magnified, omitted or schematically illustrated in the drawings for clarity and convenience of depiction. Also, the dimension of each element may not be illustrated proportionally.

Figure 2:
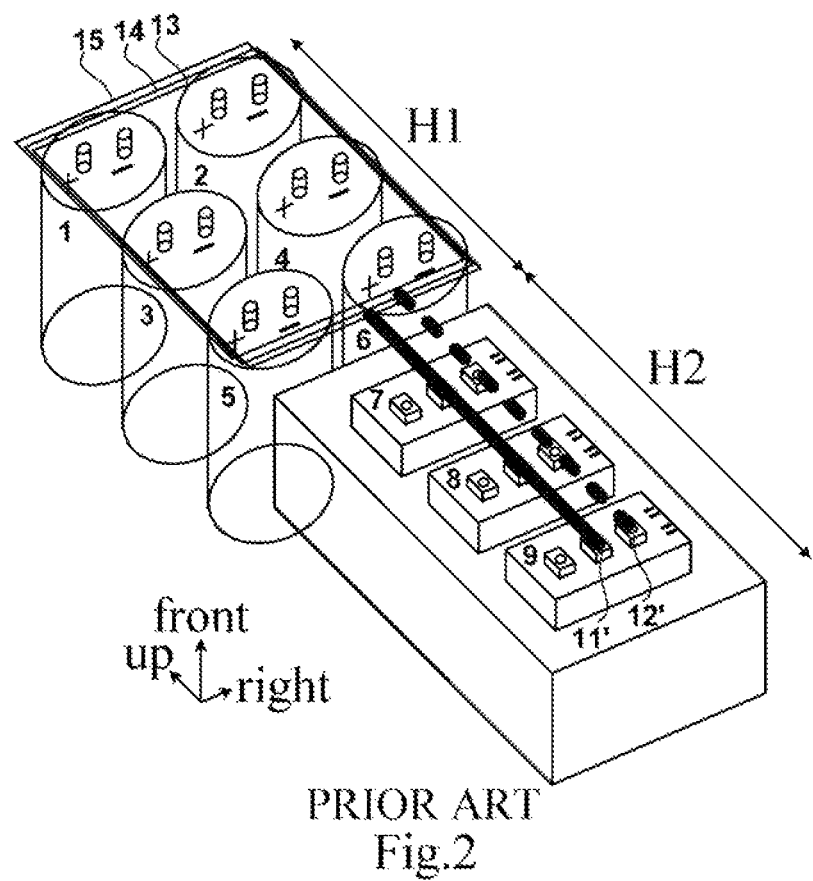
FIG. 2 is a perspective view illustrating a converter power unit according to another embodiment of the prior art.

As shown in FIGS. 1~2, a power structure of the high power converter typically includes: a heat sink; power switch modules positioned on the heat sink; DC(Direct Current)-link capacitors; and bus bars for connecting the power switch modules to the DC-link capacitors.

Figure 3:
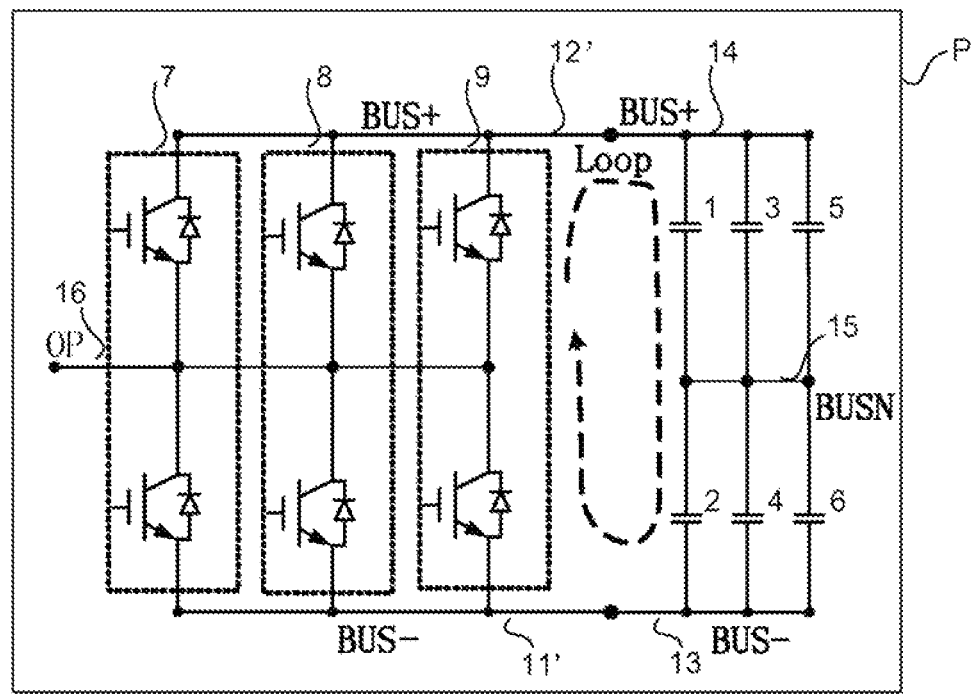
FIG. 3 is a circuit diagram illustrating a single-phase converter power unit.

As an example, a power structure of a high power voltage source converter (VSC) designed for two-level topology is illustrated. As shown in FIG. 3, a single-phase power unit of the converter includes three power switch modules 7~9 connected in parallel, DC-link capacitors 1~6, bus bars 11', 12' and 13~15 connecting the power switch modules 7~9 and the DC-link capacitors 1~6, and a heat sink 10, etc. Positive terminals of the power switch modules 7~9 are connected via the bus bar 12', negative terminals of the power switch modules 7~9 are connected via the bus bar 11', and AC output terminals OP of the power switch modules 7~9 are connected via a bus bar 16 to output an AC voltage or current.

Figure 4:
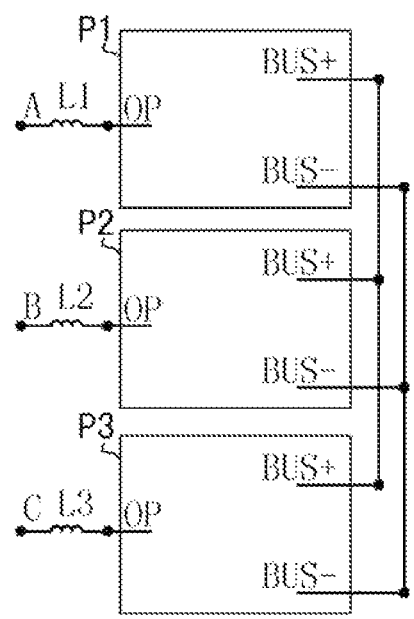
FIG. 4 is a circuit diagram illustrating a three-phase converter consisting of three single-phase power units shown in FIG. 3.

As shown in FIG. 4, three groups of the single-phase power units P1~P3 described above may constitute a three-phase converter, in which the power unit of each phase has the same element structure and performance. Positive terminals BUS+ and negative terminals BUS− of the bus bars in the power unit of each phase are connected respectively. Moreover, an output terminal OP of the power unit P1 is connected to an reactor L1 of phase A, an output terminal OP of the power unit P2 is connected to an reactor L2 of phase B, and an output terminal OP of the power unit P3 is connected to an reactor L3 of phase C.

Figure 5:
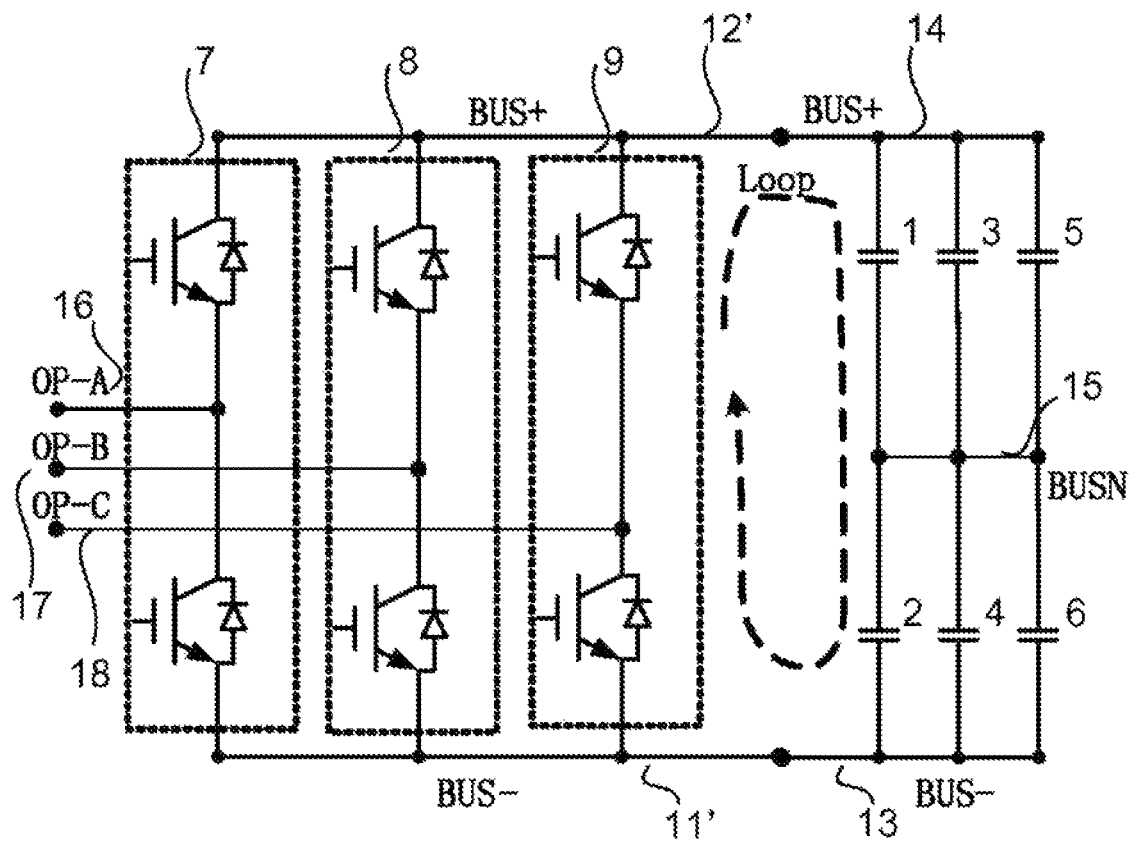
FIG. 5 is a circuit diagram illustrating a three-phase converter power unit.

In addition, a three-phase power unit may be formed on a single heat sink, as shown in FIG. 5. Different from FIG. 3 in which a single-phase power unit is formed on one heat sink, the AC output terminals OP-A, OP-B and OP-C of each power switch modules of the three-phase power unit are respectively connected with bus bars 16~18 so as to output three AC voltages or currents (of phases A, B and C) to the reactors.

As shown in FIGS. 1~2, taking a single-phase power unit with a vertical ventilation mode as an example, power switch modules 7~9 in such single-phase power unit are arranged in parallel with equal intervals on a vertical heat sink. Moreover, the arrangement of a single-phase power unit with a horizontal ventilation mode is similar to that of the single-phase power unit with the vertical ventilation mode mentioned above. The bus bars 11' and 12' are used to respectively connect the negative and positive terminals of the power switch modules 7~9, so as to be easily connected with the negative and positive terminals of a capacitor group CAP which is consisting of DC-link capacitors 1~6. The capacitors in the DC-link capacitor group CAP are connected by the laminated bus bars 13~15. One sides of the stripped bus bars 11' and 12' are respectively connected to (namely, attached to) the negative and positive terminals of the power switch modules, and the other sides thereof are respectively attached to the positive and negative terminals of the capacitor group CAP via the laminated bus bars 13~14.

Still taking the single-phase power unit formed on the single heat sink as an example, as shown in FIG. 3, the bus bars 12', 11' and 13~15 include: the stripped bus bars 12' and 11' respectively connected to the positive and negative terminals of the power switch modules 7~9 so as to draw out a positive terminal BUS+ and a negative terminal BUS−; the laminated bus bar 14 connected to the positive terminal of the capacitors 1, 3 and 5 in the capacitor group CAP to draw out a positive terminal BUS+; the laminated bus bar 13 connected to the negative terminal of the capacitors 2, 4 and 6 in the capacitor group CAP to draw out a negative terminal BUS−; and the laminated bus bar 15 connected in serial to the negative terminals of the capacitor 1, 3 and 5 and the positive terminals of the capacitor 2, 4 and 6, so as to form a neutral terminal BUSN.

The capacitor group CAP connected by the laminated bus bars may effectively reduce stray inductances in the connection of the capacitors, and thereby reduce a voltage stress of the power switch modules during switching, such that the reliability of its operation may be improved.

Switching elements 7~9 used in the power switch modules of the converter may be selected from the package forms of 62 mm, EconoDual, PrimePACK and IHM/IHV, etc. What the package forms of 62 mm, PrimePACK and IHM/IHV have in common is that the electrical connection terminals thereof are all arranged on the top of the power switch modules, which is different from the package form of EconoDual in which the electrical connection terminals are arranged at both sides thereof.

Figure 6:
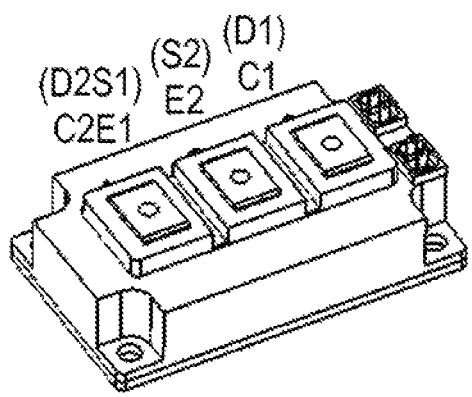
FIG. 6 is a structural diagram illustrating a power switch module of the converter.
Figure 7:
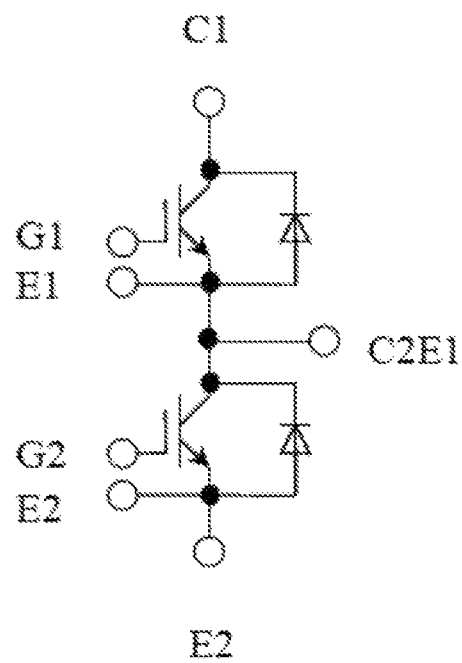
FIG. 7 is a circuit diagram illustrating an electrical connection in the case that IGBT module is used as the power switch module.

Hereinafter, for example, 62 mm packaged IGBT modules are taken as the switching elements. The structure of the 62 mm packaged IGBT module is shown in FIG. 6, and its electrical connection circuit is shown in FIG. 7. In FIGS. 6 and 7, C1 is a collector terminal of the top IGBT, placed at one side of the three terminals of the IGBT module, used as a positive terminal of the IGBT module, and to be connected with the stripped bus bar 12' in the circuit; E2 is an emitter terminal of the bottom IGBT, placed in the middle of the three terminals of the IGBT module, used as a negative terminal of the IGBT module, and to be connected with the stripped bus bar 11' in the circuit; and C2E1 is a terminal formed by connecting the emitter of the top IGBT and the collector of the bottom IGBT, placed at the other side of the IGBT module, and to be connected with the output terminal OP of the converter in the circuit.

Figure 8:
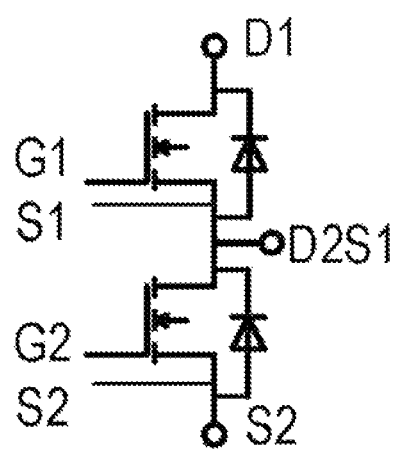
FIG. 8 is a circuit diagram illustrating an electric connection in the case that MOSFET module is used as the power switch module.

Alternatively, the switching elements may use the 62 mm packaged MOSFET modules, a structure of which is also shown in FIG. 6, and an electrical connection circuit of which is shown in FIG. 8. In FIGS. 6 and 8, D1 is a drain terminal of the top MOSFET, placed at one side of the three terminals of the MOSFET module, used as a positive terminal of the MOSFET module, and to be connected with the stripped bus bar 12' in the circuit; S2 is a source terminal of the bottom MOSFET placed in the middle of the three terminals of the MOSFET module, used as a negative terminal of the MOSFET module, and to be connected with the stripped bus bar 11' in the circuit; and D2S1 is a terminal formed by connecting a source of the top MOSFET and a drain of the bottom MOSFET, placed at the other side of the MOSFET module, and to be connected with the output terminal OP of the converter in the circuit. Moreover, other types of well-known power switch modules, such as IGCT modules, may be used as the power switch modules of the present application.

As shown in the power circuit in FIG. 3, each single-phase power unit is formed by three IGBT modules connected in parallel, wherein E2 terminals of the IGBT modules are connected to the bus bar 11', C1 terminals of the IGBT modules are connected to the bus bar 12', and C2E1 terminals of the IGBT modules are connected to the bus bar 16 to be used as the output terminal OP.

In the prior art, there are typically two structure forms of connecting the power switch modules (e.g., the IGBT modules, hereinafter the IGBT modules are used to refer to the power switch modules) and the DC-link capacitors. One of them is placing the capacitor group CAP on the left or right side of the IGBT modules connected in parallel, as shown in FIG. 1. In this way, the stripped bus bars 12' and 11' connected to the positive or negative terminals of the IGBT modules extend to the left or right to the laminated bus bars 14 and 13 connected to the positive and negative terminals of the capacitors group CAP, wherein the stripped bus bar 12' is connected to the laminated bus bar 14, and the stripped bus bar 11' is connected to the laminated bus bars 13.

However, this form may have two deficiencies. The first deficiency is that since the bus bars 11' and 12' connected to the IGBT modules have to keep away from other terminals or other components in the converter, the effective widths of the bus bars 11' and 12' become narrow. In this case, the bus bars 11' and 12' could only be implemented in a form of narrow copper strips (hereinafter referred to as the stripped bus bars), but can not be designed to have a structure of large-area laminated bus bars as the laminated bus bars 13~15 connected to the capacitors, thus limiting the further reduction of the stray inductances of the bus bars. The second deficiency is that since the capacitor group CAP is placed on one side of the IGBT modules, in case of the width of the IGBT modules and the heat sink is W1, the width of the capacitor group CAP is W2, then the width of the single-phase power unit consisting of the capacitor group CAP and the IGBT modules is a sum of W1 and W2. In this way, the converter consisting of three such single-phase power units may have a relatively large width and thus need a wider cabinet for accommodation, thereby resulting in a smaller power density of the system.

The other structure form is placing the DC-link capacitor group on an upper or lower side of the IGBT modules connected in parallel, as shown in FIG. 2. In this way, in order to extend vertically to the laminated bus bars 13~14 and keep away from other parts, the bus bars 11' and 12' also need to be made stripped. Moreover, since the DC-link capacitor group CAP is placed on the upper or lower side of the IGBT modules, in case of the height of the capacitor group CAP is H1, the height of the power switch modules and heat sink is H2, then the height of the single-phase power unit is a sum of H1 and H2, thereby similarly resulting in the deficiency of smaller power density of the system. Further, since in this structure form, the distances from the three IGBT modules 7~9 connected in parallel to the DC-link capacitor group CAP are different, the stripped bus bars 11' and 12' connected therebetween have different distances, the stray inductances of the IGBT modules are different from each other. During the dynamic current commutating in the power switch modules, the smaller the stray inductances are, the larger the dynamic currents in the IGBT modules are. Therefore, among those three IGBT modules connected in parallel having different stray inductances in the current commutating loop, the IGBT module 7 with the lowest stray inductance has the largest dynamic current, and the IGBT module 9 with the largest stray inductance has the lowest dynamic current. Accordingly, the dynamic currents in those three IGBT modules are not identical, the IGBT module bearing with larger dynamic current may have a lower usage security and a shorter lifespan than the IGBT module bearing with less dynamic current, and this may finally reduce the reliability and the service lifespan of the whole system.

From above, in the power structure of the high power converter, the stray inductances in the commutating loop formed between the power switch modules and the DC-link capacitor group should be kept to the minimum. The larger the stray inductance is, the higher the peak voltage generated when turning off the power switch module is. If the peak voltage exceeds the rating voltage of the power switch module, the power switch module may be damaged by overvoltage. Accordingly, in the design of the power structure, the stray inductances in the commutating loop should be reduced to the least extent. One method of effectively reducing the stray inductances in the commutating loop is to improve the structure of the laminated bus bars connecting between the power switch modules and the DC-link capacitor group.

In the embodiments listed below, like reference numbers will be used to refer to like parts as in the above embodiments.

The commutating loop of the converter consists of two portions, one is a first group of laminated bus bars including laminated bus bars 12 and 11 (namely, a first and second bus bars) respectively connected to the positive and negative terminals of each power switch modules, and the other is a second group of laminated bus bars including the laminated bus bars 14 and 13 (namely, a third and fourth bus bars) respectively connected to the positive and negative terminals of the DC-link capacitors, and the second group of laminated bus bars may also includes the laminated bus bar 15 (namely, a fifth bus bar) having a neutral terminal BUSN, wherein the laminated bus bars 12, 11, 14, 13 and 15 are all made of conductive materials. The stray inductances of both portions will effect on the stray inductances of the whole commutating loop, thereby it should be considered to optimize the power structure so as to minimize the stray inductances.

According to the embodiments of the present application, the converter power unit is illustrated as a power unit with two voltage levels circuit topology, and a single-phase bridge arm of the converter consists of three power switch modules connected in parallel. However, the embodiments of the present application are not limited thereto, the converter power unit may be one power switch module, or may consist of two or n power switch modules connected in parallel (n is an integer and n≥1). The capacitor group CAP in the power unit consists of six DC-link capacitors connected in series and in parallel, i.e., six DC-link capacitors are divided into three groups, each group including two DC-link capacitors connected in series, and the three groups are connected in parallel. However, the embodiments of the present application are not limited thereto, the capacitor group CAP may only include one DC-link capacitor, or may include two or m DC-link capacitors (m is an integer and m≥1).

Figure 9:
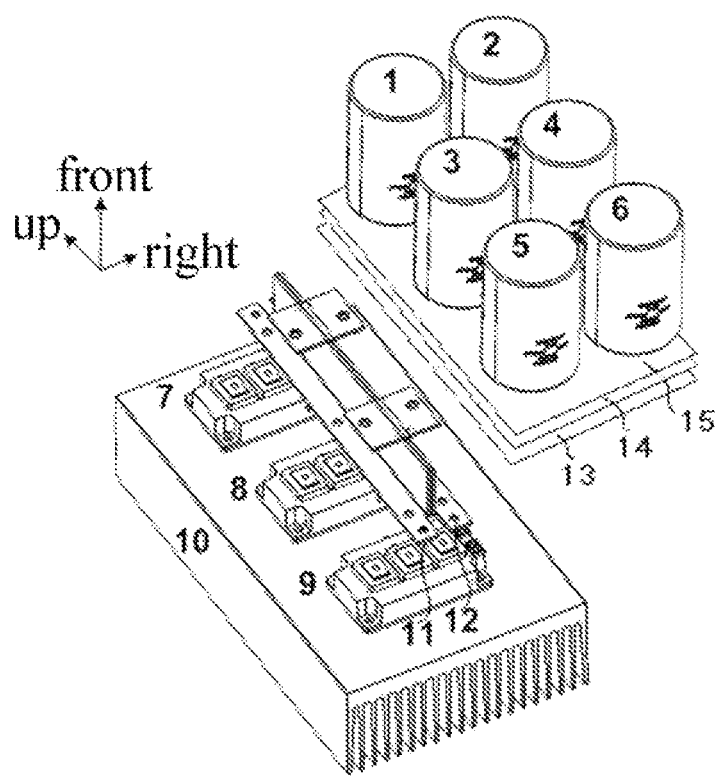
FIG. 9 is a perspective view illustrating a converter power unit according to one embodiment of the present application.

Terminals having the same polarity of the n power switch modules may be placed in the same direction, and may be arranged in parallel along a width direction (namely, the up and down direction indicated by an up arrow in FIG. 9) of the power switch modules, and the electrodes of each DC-link capacitor in the capacitor group CAP are all positioned in a direction towards the power switch modules (namely, the direction opposite to the direction indicated by the forward arrow in FIG. 9), so that the capacitor group CAP can substantially overlap in front of the n power switch modules via the second group of laminated bus bars and the first group of laminated bus bars connected with each other. However, the embodiments of the present application are not limited thereto. For example, the n power switch modules may be arranged in parallel along a length direction (namely, the left-right direction indicated by the right arrow in FIG. 9) of the power switch modules, and so on.

Similarly, the power switch modules in the present application may be selected from IGBT modules, MOSFET modules, IGCT modules, and the like. Hereinafter, the IGBT modules are used to refer to the power switch modules.

Figure 10:
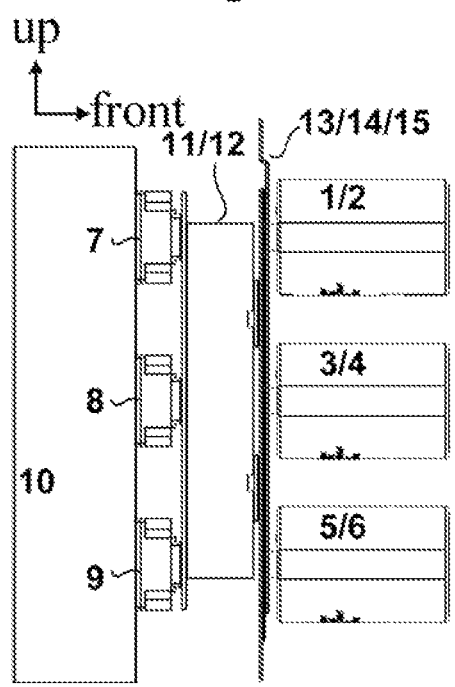
FIG. 10 is a side view illustrating the converter power unit shown in FIG. 9.

According to the embodiments of the present application, as shown in FIG. 9 and FIG. 10, the converter power unit includes a heat sink 10, the IGBT modules 7~9 positioned in parallel (which may be placed with equal intervals) on the heat sink 10, the DC-link capacitors 1~6 arranged in a form of 2×3 array (which may be uniformly placed and constitute the capacitor group CAP), the laminated bus bars 11~12 of the IGBT modules, and the laminated bus bars 13~15 of the DC-link capacitors 1~6. However, the embodiments of the present application are not limited thereto.

According to the embodiments of the present application, the power unit may have a single-phase, three-phase or multi-phase AC output. For example, in the case that the power unit has a single-phase AC output, the power unit is a single-phase power unit and has a circuit diagram which is similar to the circuit diagram shown in FIG. 3, wherein the AC output terminals OP of the power switch modules 7~9 are connected via one bus bar (for example, the bus bar 16) to output one phase of AC voltage or current. In the case that the power unit has a three-phase AC output, the power unit is a three-phase power unit and has a circuit diagram which is similar to the circuit diagram shown in FIG. 5, wherein the AC output terminals OP-A, OP-B and OP-C of the power switch modules 7~9 output three phases of AC voltages or currents (of phases A, B and C respectively) to the reactor via respective bus bar (for example, the bus bars 16~18). In the case that the power unit has a multi-phase AC output other than single-phase or three-phase, the terminal connection and the AC output thereof may go in the same way.

One side of the laminated bus bar 11 is connected to the negative terminals of the IGBT modules 7~9, and the other side is connected to the laminated bus bar 13 of the capacitor group CAP. One side of the laminated bus bas 12 is connected to the positive terminals of the IGBT modules 7~9, and the other side is connected to the laminated bus bar 14 of the capacitor group CAP. In this way, the positive terminals of the power switch modules are connected with the positive terminals of the capacitor group CAP, and the negative terminals of the power switch modules are connected with the negative terminals of the capacitor group CAP.

The capacitor group CAP overlaps in front of the power switch modules 7~9 via the first group of laminated bus bars and the second group of laminated bus bars.

Figure 11:
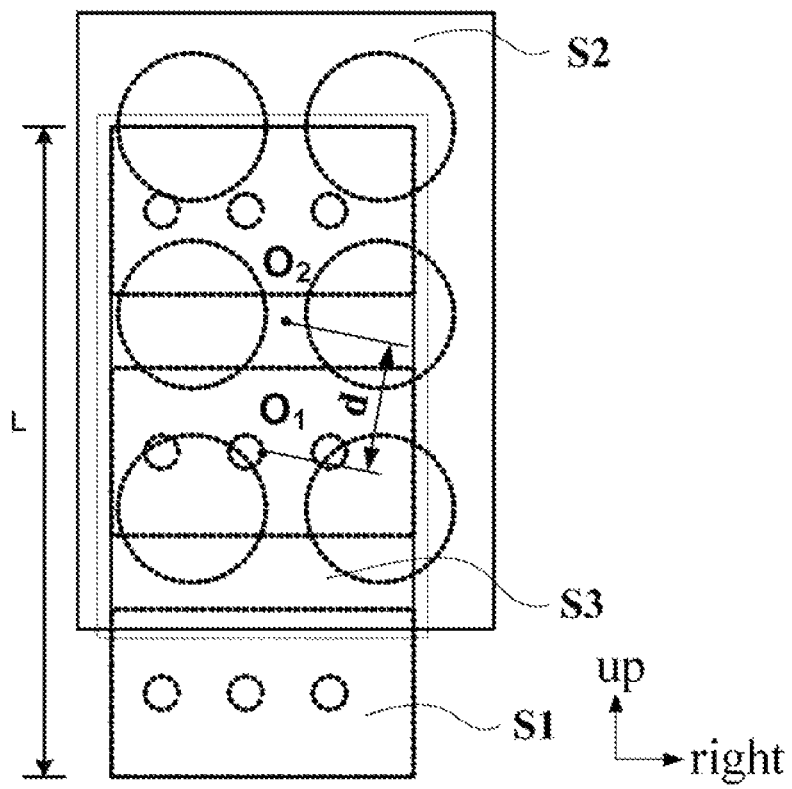
FIG. 11 is a front view illustrating the converter power unit shown in FIG. 9.

According to the embodiments of the present application, as shown in FIG. 11, if a direction from the power switch modules 7~9 towards the capacitor group CAP is defined as an axial direction (or referred to as an axial direction of the capacitor group, which is the front-back direction indicated by the forward arrow in FIG. 9), a projection area S1 is projected by an area occupied by the n power switch modules on a vertical projection plane thereof (a first plane) which is perpendicular to an axial direction, a projection area S2 is projected by the capacitor group CAP on the vertical projection plane, and the projection areas S1 and S2 have an overlapped area S3 (which is the area within the dashdotted frame in FIG. 11). In case of a center point of the projection area S1 is defined as a first center point $O_1$ and a center point of the projection area S2 is defined as a second center point $O_2$, a distance d between the first center point $O_1$ and the second center point $O_2$ should satisfy the following equation: $0 \leq d \leq L/2$, wherein L is a length of the projection area S1 projected by an area occupied by the n power switch modules on the vertical projection plane, and this length refers to the length of the projection area S1 extending along the up-down direction indicated by the upward arrow in FIG. 9 to FIG. 11.

The projection area S1 projected by an area occupied by the n power switch modules on the vertical projection plane may varied depending on the numbers of the power switch modules. For example, when n=1, the projection area S1 is a projection area projected by the power switch module per se; when n=2, the projection area S1 is a projection area projected by two power switch modules and an interval therebetween; and when n=3,4,5 . . . , the projection areas S1 go in the same way. However, the embodiments of the present application are not limited thereto. Similarly, the projection area S2 projected by the capacitor group CAP on the vertical projection plane which is perpendicular to the axial direction may be defined in the same way.

According to the embodiments of the present application, each of the laminated bus bar 12 and the laminated bus bar 11 includes: a connection portion for the power switch modules, which is on one side of the laminated bus bar 12 or the laminated bus bar 11 and is connected to the positive terminal or negative terminal of the power switch modules, wherein the connection portion for the power switch modules has connection holes for power switch modules thereon; and a connection portion for the capacitor group, which is on the other side of the laminated bus bar 12 or laminated bus bars 11 and is connected to the laminated bus bar 14 or the laminated bus bar 13, wherein the connection portion for the capacitor group has connection holes for capacitor group thereon.

Each of the laminated bus bar 12 and the laminated bus bar 11 further includes a support portion connected to the connection portion for the power switch modules and the connection portion for the capacitor group of the laminated bus bar 12 or the laminated bus bar 11, wherein the support portion of the laminated bus bar 12 and the support portion of the laminated bus bar 11 are adjacently overlapped to form a juxtaposition structure of support portion. The connection portion for the power switch modules and the connection portion for the capacitor group of the laminated bus bar 12 are placed on one side of the juxtaposition structure of support portion, and the connection portion for the power switch modules and the connection portion for the capacitor group of the laminated bus bar 11 are placed on the other side of the juxtaposition structure of support portion.

Structures of the laminated bus bars 11 and 12 of the IGBT modules are shown in FIGS. 12~15. Taking the laminated bus bar 12 as an example, which includes: a connection portion for IGBT module (namely, connection portion for power switch module) 12-a, a support portion 12-b, and a connection portion for the capacitor group 12-c.

The connection portion for IGBT module 12-a is formed by bending one end of the laminated bus bar 12 by about 90° to one side, and there are three connection holes for power switch module (i.e., connection holes for IGBT module) 12-1, 12-2, 12-3 on the connection portion for IGBT modules 12-a, those three connection holes correspond to the three terminals C1 (positive) of the IGBT modules 7~9.

According to the embodiments of the present application, the connection portion for IGBT modules 12-a is not limited to a complete strip constituted by the whole bent portion, but may be an incomplete strip constituted by several portions (each portion may be referred to as a terminal block) with notches therebetween. The terminal blocks on the incomplete strip have a length less than the preset length of the support portion 12-b.

The other end of the laminated bus bar 12 is also bent by about 90° to the same side with the connection portion for IGBT modules 12-a, so as to form the connection portion for the capacitor group 12-c. In the present embodiment, the connection portion for the capacitor group 12-c includes two connection holes for capacitor group 12-4 and 12-5 which are placed at the corresponding position on the incomplete strip with notches therebetween for respectively connecting to the laminated bus bar 14 of the capacitor group CAP. The number of the connection holes for capacitor group may not limited to two, but may be one or more than two. Meanwhile, the connection portion for the capacitor group 12-c may not be limited to the form of the incomplete strip constituted by several portions with notches therebetween, but it may be in a form of the complete strip formed by the whole bent portion, just as the form of the connection portion for IGBT modules 12-a, with holes 12-4 and 12-5 at corresponding positions on the strip.

According to the embodiments of the present application, the support portion 12-b of the laminated bus bar 12 of the IGBT modules is a rectangular flat plate having a preset length and a preset width. The support portion 12-b is used to connect the connection portion for IGBT modules 12-a with the connection portion for the capacitor group 12-c, and can support them. The direction of the preset length of the support portion 12-b refers to the direction of the support portion 12-b extending along the up-down direction indicated by the upward arrow in FIG. 9 to FIG. 12, and the direction of the preset width of the support portion 12-b refers to the direction of the support portion 12-b extending along the front-back direction indicated by the forward arrow in FIG. 9 to FIG. 12.

The preset length of the support portion may be equal to or greater than a distance between the terminals with the same polarity of two power switch modules, which are respectively placed at two ends of the projection area S1 of the n power switch modules along its length direction on the vertical projection plane which is perpendicular to the axial direction, and the preset width of the support portion may be equal to or greater than 0. For example, according to the present embodiment, the preset length of the support portion 12-b may be equal to or greater than a distance between the terminal C1 (positive terminal) of the IGBT module 7 and the terminal C1 (negative terminal) of the IGBT module 9. However, the embodiments of the present application are not limited thereto.

The experiments show that the longer the preset length of the support portion 12-b is and the shorter the preset width is, the less the stray inductance of the laminated bus bar is. However, when actually fabricating the laminated bus bars 11 and 12, the preset lengths of their support portions are restricted by such as the height of the IGBT modules or other factors, and thereby can not be enlarged illimitably. Moreover, the preset widths of their support portions are also be restricted by the sizes or positions of some parts or components of the converter mounted near the support portion.

Similarly to the structure of the laminated bus bar 12, the laminated bus bar 11 includes: a connection portion for IGBT modules 11-a, a support portion 11-b, and a connection portion for the capacitor group 11-c, wherein the connection portion for IGBT modules 11-a has three connection holes for IGBT modules 11-1, 11-2 and 11-3 which are used for respectively connecting to the terminals E2 (negative) of the IGBT modules 7-9, and the connection portion for the capacitor group 11-c includes two terminal blocks with connection holes for capacitor group 11-4 and 11-5 thereon, and the connection holes for capacitor group 11-4 and 11-5 are used for connecting to the laminated bus bar 13 of the capacitor group.

The laminated bus bars 11 and 12 may be bilateral symmetry in structure, namely, the laminated bus bar 11 and the laminated bus bar 12 are mirror symmetry along the length direction of the support portions 11-b and 12-b.

Figure 12:
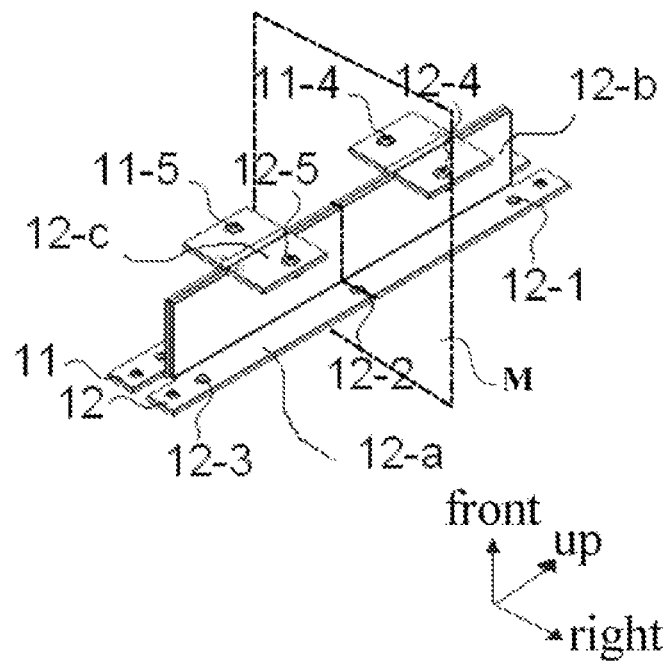
FIG. 12 is a perspective view illustrating laminated bus bars according to one embodiment of the present application.
Figure 13:
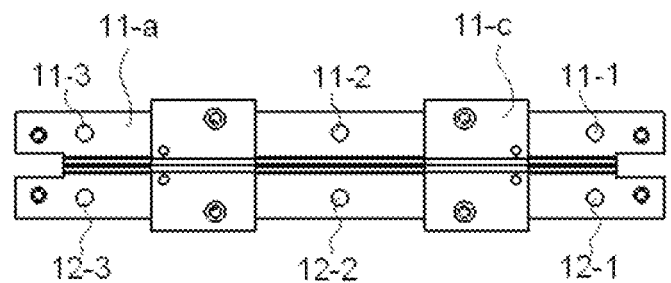
FIG. 13 is a front view illustrating the laminated bus bars shown in FIG. 12.
Figure 14:
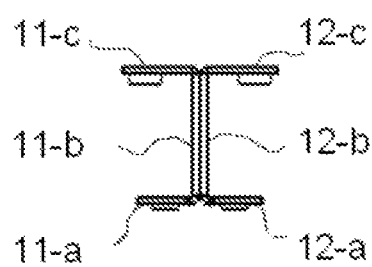
FIG. 14 is a top view illustrating the laminated bus bars shown in FIG. 12.
Figure 15:
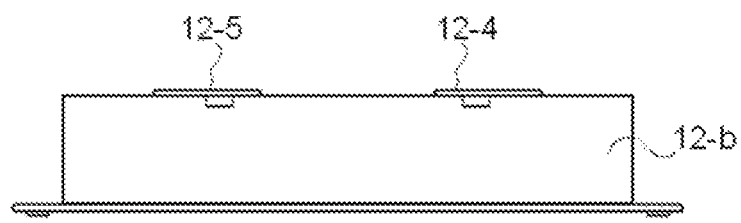
FIG. 15 is a side view illustrating the laminated bus bars shown in FIG. 12.

As shown in FIG. 12 and FIG. 14, the two support portions 11-b and 12-b are adjacently overlapped together to form a juxtaposition structure of support portion, and an insulation layer may be interposed therebetween. The two connection portions for IGBT modules 11-a and 12-a are respectively placed on two sides of the juxtaposition structure of support portion and are closer to the IGBT modules 7~9, and the two connection portions for capacitor group 11-c and 12-c are respectively placed on two sides of the juxtaposition structure of support portion and are closer to the capacitor group.

In this way, the connection portions for power switch modules, the support portions and the connection portions for capacitor group of the laminated bus bars 11 and 12 together form a "⊥" shaped figure, wherein the two support portions 11-b and 12-b and the insulation layer therebetween form a middle vertical bar of the "⊥" shaped figure, and the two connection portions for power switch modules 11-a and 12-a and the two connection portions for capacitor group 11-c and 12-c may respectively form half left and half right portions of the top or bottom transverse bars of the "⊥" shaped figure.

As shown in FIG. 12, the connection holes for power switch modules 11-1, 11-2, 11-3 and the connection holes for power switch modules 12-1, 12-2 and 12-3 may be configured symmetrically with respect to a perpendicular bisection plane M (as indicated by the dashdotted region M in FIG. 12) that equally divides the preset length of the support portions into two parts, so does the connection holes for capacitor group 11-4, 11-5 and the connection holes for capacitor group 12-4 and 12-5.

Moreover, the power switch modules 7-9 may be configured to be bilateral and longitudinal symmetry about the first center point $O_1$; and the capacitor group CAP may also be configured to be bilateral and longitudinal symmetry about the second center point $O_2$. However, the embodiments of the present application are not limited thereto. For example, the IGBT modules 7, 8 and 9 may be fixed on the vertically placed heat sink 10 with unequal intervals, in this case, the positions of the connection portions for IGBT modules of the laminated bus bars 11 and 12 are required to be corresponding to the positions of the IGBT modules to be connected.

During installation, the support portions 11-b and 12-b of the laminated bus bars 11 and 12 are tightly overlapped together back to back, with an insulation layer interposed therebetween to space them apart for ensuring enough withstand voltage capacity, so as to form the juxtaposition structure of support portion. The distance between the two support portions of the laminated bus bars should be equal to or less than the distance between the terminal C1 (positive) and the terminal E2 (negative) of any one of the IGBT modules (as to the 62 mm packaged modules, this distance is about 14 mm). The laminated bus bars 11 and 12 have relatively longer length (corresponding to the preset length of the support portion) and relatively shorter width (corresponding to the preset width of the support portion), thereby have stray inductances much less than that of the stripped bus bars 11' and 12' in the prior art shown in FIGS. 1-2. As a result, the sum of the stray inductances of the commutating loop of the IGBT modules can be reduced. The experiments shows that the stripped bus bars 11' and 12' in the prior art may have a sum of stray inductances typically more than 200 nH, while the stray inductances in the laminated bus bars 11 and 12 of the present application can be reduced to a sum less than 100 nH.

According to the embodiments of the present application, the terminal blocks of the connection portion for the capacitor group 11-*c* may be symmetrically arranged with respect to the perpendicular bisection plane M that equally divides the preset length of the support portion into two parts, and the terminal blocks of the connection portion for the capacitor group 12-*c* may also be symmetrically arranged with respect to the perpendicular bisection plane M, such that the three IGBT modules 7~9 may have more uniform stray inductances, and the IGBT modules may have the same dynamic current during current commutating. As a result, the IGBT modules connected in parallel may have a coincident operation state and a similar usage lifespan, thereby the reliability and the usage lifespan of the whole system can be increased.

Figure 16:
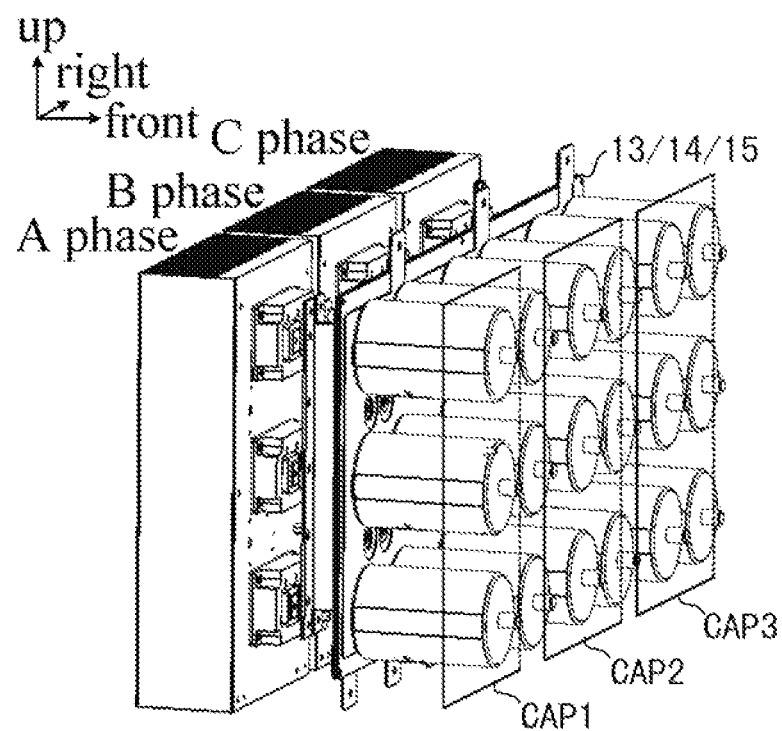
FIG. 16 is a perspective view illustrating a three-phase converter according to one embodiment of the present application.

As described above, a three-phase converter may be constituted by three of the above-mentioned single-phase power units. FIG. 16 is a perspective view illustrating the three-phase converter according to one embodiment of the present application.

Figure 17:
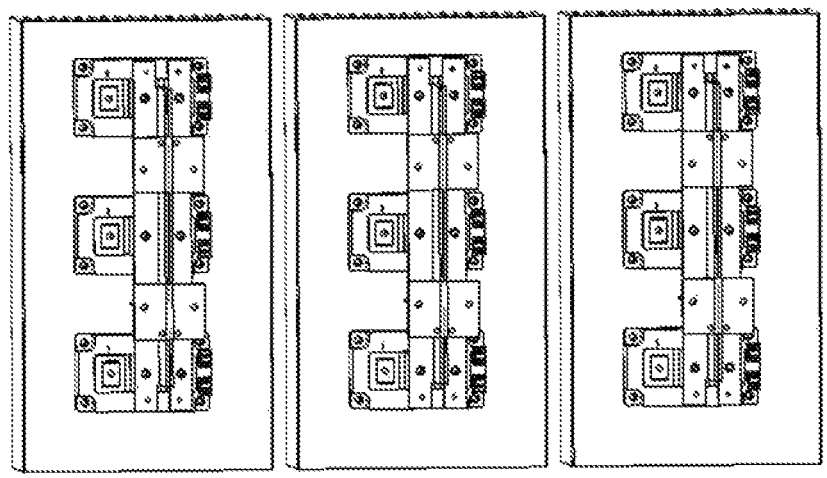
FIG. 17 is a front view illustrating the three-phase converter shown in FIG. 16, in which the capacitor group and the laminated bus bars connected thereto are omitted.

Three single-phase power units are placed side by side in their respective accommodating cabinet, so as to form three phases A, B and C of the three-phase converter. FIG. 17 shows the structures and configurations of the heat sink, the IGBT modules and their respective laminated bus bars 11 and 12 without the DC-link capacitor group CAP and the laminated bus bars 13~15 connected thereto.

Figure 18:
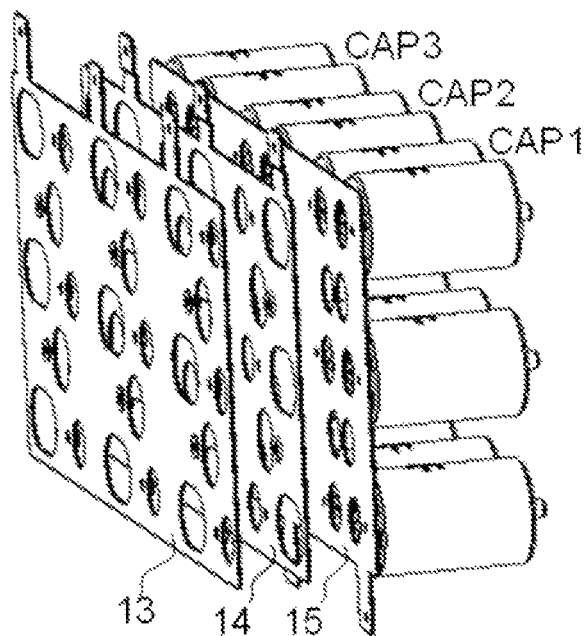
FIG. 18 is an exploded perspective view illustrating the capacitor group and the laminated bus bars connected thereto of the three-phase converter shown in FIG. 16.
Figure 19:
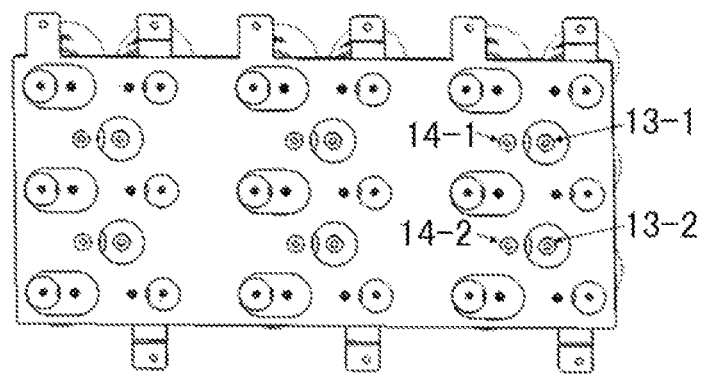
FIG. 19 is a back view illustrating the capacitor group and the laminated bus bars connected thereto shown in FIG. 18.

Referring back to FIG. 16, CAP1 among the three capacitor groups includes six capacitors placed in front of the IGBT modules of phase A, CAP2 among the capacitor groups includes sixth capacitors placed in front of the IGBT modules of phases B, and CAP3 among the capacitor groups includes sixth capacitors placed in front of the IGBT modules of phase C. Those three capacitor groups CAP1, CAP2 and CAP3 may be connected by the laminated bus bars 13~15 each having been integrated as a whole. The detailed structures of the laminated bus bars 13~15 are shown in FIG. 18. The laminated bus bars 13~15 are large-area laminated bus bars which are tightly overlapped with each other, with an insulation layer interposed between every two adjacent laminated bus bars for enough insulation intensity. The laminated bus bar 13 connects the negative terminals of the capacitors 2, 4 and 6 in the capacitor groups CAP1, CAP2 and CAP3 to form a negative terminal BUS−, the laminated bus bars 14 connects the positive terminal of the capacitor 1, 3 and 5 in the capacitor groups CAP1, CAP2 and CAP3 to form a positive terminal BUS+, and the laminated bus bars 15 connects in series the negative terminals of the capacitors 1, 3 and 5 and the positive terminals of the capacitors 2, 4 and 6 in the capacitor groups CAP1, CAP2 and CAP3 to form a neutral terminal BUSN. In order to satisfy the requirements of insulation from each other, holes having enough sizes should be opened in every layer of the laminated bus bars 13~15 to expose the electrical connection terminals of other laminated bus bars (as shown in FIG. 19).

Figure 20:
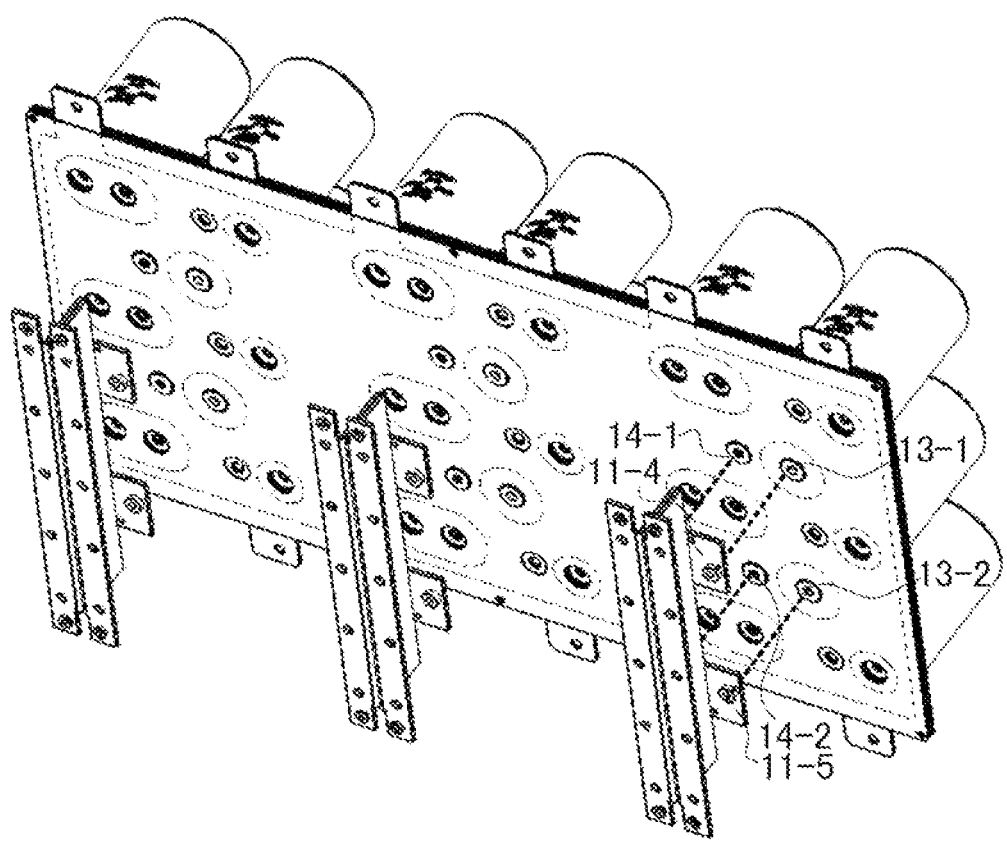
FIG. 20 is a view illustrating the connection relationship between the laminated bus bars connected to the power switch modules and the laminated bus bars connected to the capacitor group of the three-phase converter shown in FIG. 16.

The laminated bus bars 13~15 are connected to their respective three-phase capacitor group CAP, and also connected to the laminated bus bars 11-12. As shown in FIG. 20, self-clinching screw holes (or convex screw holes) 13-1 and 13-2 are configured on the laminated bus bar 13 at positions to be connected to the connection holes for capacitor group 11-4 and 11-5 of the laminated bus bar 11. Self-clinching screw holes (or convex screw holes) 14-1 and 14-2 are configured on the laminated bus bar 14 at positions to be connected to the connection holes for capacitor group 12-4 and 12-5 of the laminated bus bar 12. Moreover, holes with enough sizes are opened at corresponding positions of the laminated bus bar 13 for exposing the self-clinching screw holes (or convex screw holes) 14-1 and 14-2. In this way, the connection holes for capacitor group 11-4 and 11-5 of the laminated bus bar 11 are respectively connected to the screw holes 13-1 and 13-2 of the laminated bus bar 13, and the connection holes for capacitor group 12-4 and 12-5 of the laminated bus bar 12 are respectively connected to the screw holes 14-1 and 14-2 of the laminated bus bar 14, such connection relationships are indicated by the broken lines in FIG. 20. However, the embodiments of the present application are not limited thereto.

It is apparent that those skilled in the art may conceive any modifications and variations to the present invention without departing from the spirit and the scope of the present invention. In this way, the present invention intends to cover the various modifications and variations to the present invention, provided that they are within the scope of the claims and their equivalents of the present invention.

What is claimed is:

1. A converter power unit, comprising:
   a heat sink;
   n power switch modules positioned on the heat sink, each of the power switch modules having a positive terminal and a negative terminal, wherein n is an integer and n≥1;
   a first group of laminated bus bars comprising a first bus bar and a second bus bar, the first bus bar being connected to the positive terminals of the power switch modules, and the second bus bar being connected to the negative terminals of the power switch modules;
   a capacitor group comprising m capacitors and having a positive terminal and a negative terminal, wherein m is an integer and m≥1; and
   a second group of laminated bus bars comprising a third bus bar and a fourth bus bar, the third bus bar being connected to the positive terminal of the capacitor group, and the fourth bus bar being connected to the negative terminal of the capacitor group, wherein
   the first bus bar is connected with the third bus bar, and the second bus bar is connected with the fourth bus bar; and
   wherein a vertical projection area projected by an area occupied by the n power switch modules on a first plane is defined as a first projection area, and a vertical projection area projected by the capacitor group on the first plane is defined as a second projection area, the first projection area and the second projection area have an overlapped area overlapped each other, wherein the first plane is a plane that is perpendicular to an axial direction of the capacitor group.

2. The converter power unit according to claim 1, wherein each of the first bus bar and the second bus bar comprises:
   a connection portion for the power switch modules placed on one side of the first bus bar or the second bus bar and being connected to the positive or negative terminal of each power switch module, the connection portion for the power switch modules is provided with connection holes for the power switch modules thereon; and
   a connection portion for the capacitor group placed on the other side of the first bus bar or the second bus bar and being connected to the third bus bar or the fourth bus bar, the connection portion for the capacitor group is provided with connection holes for the capacitor group thereon.

3. The converter power unit according to claim 2, wherein each of the first bus bar and the second bus bar further comprises:
   a support portion connected to the connection portion for the power switch modules and the connection portion for the capacitor group of the first bus bar or the second bus bar, wherein the support portion of the first bus bar and the support portion of the second bus bar are adjacently overlapped to form a juxtaposition structure of support portion, the connection portion for the power switch modules and the connection portion for the capacitor group of the first bus bar are placed on one side of the juxtaposition structure of support portion, and the connection portion for the power switch modules and the connection portion for the capacitor group of the second bus bar are placed on the other side of the juxtaposition structure of support portion.

4. The converter power unit according to claim 3, wherein the connection portions for power switch modules and the connection portions for capacitor group of the first bus bar and the second bus bar, and the juxtaposition structure of support portion together form a "⊥" shaped figure, wherein the juxtaposition structure of support portion forms a middle vertical bar of the "⊥" shaped figure, the two connection portions for power switch modules respectively placed on two sides of the juxtaposition structure of support portion together form a bottom transverse bar of the "⊤" shaped figure, and the two connection portions for capacitor group respectively placed on two sides of the juxtaposition structure of support portion together form a top transverse bar of the "⊥" shaped figure.

5. The converter power unit according to claim 3, wherein the two connection portions for power switch modules and the two connection portions for capacitor group are complete strip or incomplete strip with notches.

6. The converter power unit according to claim 3, wherein the two support portions have a preset length and a preset width.

7. The converter power unit according to claim 6, wherein the preset length is equal to or greater than a distance between terminals of same polarity of two power switch modules which are positioned at two ends of the first projection area along its length direction.

8. The converter power unit according to claim 3, wherein an insulation layer is interposed between the two support portions in the juxtaposition structure of support portion.

9. The converter power unit according to claim 3, wherein an interval between the two support portions in the juxtaposition structure of support portion is equal to or less than a distance between the positive terminal and the negative terminal of each power switch module.

10. The converter power unit according to claim 3, wherein the first bus bar and the second bus bar are mirror symmetry along a length direction of the juxtaposition structure of support portion.

11. The converter power unit according to claim 6, wherein the connection holes for power switch modules or the connection holes for capacitor group are provided symmetrically with respect to a perpendicular bisection plane that equally divides the preset length of the support portion into two parts.

12. The converter power unit according to claim 1, wherein providing that a center point of the first projection area is defined as a first center point, and a center point of the second projection area is defined as a second center point, a distance d between the first center point and the second center point satisfies the following equation:

$$0 \le d \le L/2$$

wherein L is a length of the first projection area.

13. The converter power unit according to claim 1, wherein the power switch modules are IGBT modules, MOSFET modules or IGCT modules.

14. The converter power unit according to claim 1, wherein the converter power unit has one-phase, three-phase or multi-phase of AC outputs.

15. The converter power unit according to claim 14, wherein the converter power unit is a single-phase power unit, a three-phase unit or a multiphase power unit.

16. Bus bars in a converter power unit, comprising the first bus bar and the second bus bar in the converter power unit according to claim 1.

* * * * *